US008110068B2

(12) United States Patent
Qiu et al.

(10) Patent No.: US 8,110,068 B2
(45) Date of Patent: Feb. 7, 2012

(54) GAS FLOW DISTRIBUTION RECEPTACLES, PLASMA GENERATOR SYSTEMS, AND METHODS FOR PERFORMING PLASMA STRIPPING PROCESSES

(75) Inventors: Huatan Qiu, Sunnyvale, CA (US); Woody Chung, Burlingame, CA (US); Anirban Guha, Milpitas, CA (US); David Cheung, Foster City, CA (US)

(73) Assignee: Novellus Systems, Inc., San Jose, CA (US)

( * ) Notice: Subject to any disclaimer, the term of this patent is extended or adjusted under 35 U.S.C. 154(b) by 848 days.

(21) Appl. No.: 12/052,401

(22) Filed: Mar. 20, 2008

(65) Prior Publication Data

US 2009/0236313 A1 Sep. 24, 2009

(51) Int. Cl.
*H01L 21/3065* (2006.01)
*C23C 16/00* (2006.01)
*C23C 16/455* (2006.01)

(52) U.S. Cl. .............. 156/345.34; 156/345.33; 118/715
(58) Field of Classification Search .................. 118/715; 156/345.33, 345.34
See application file for complete search history.

(56) References Cited

U.S. PATENT DOCUMENTS

| 2,518,709 | A | * | 8/1950 | Mosby, Jr. ...................... 239/430 |
| 2,874,001 | A | * | 2/1959 | Webb ........................ 239/533.14 |
| 4,421,592 | A | * | 12/1983 | Shuskus et al. ............... 117/103 |
| 5,411,624 | A | * | 5/1995 | Hirano et al. ............. 156/345.46 |
| 5,439,524 | A | * | 8/1995 | Cain et al. .................. 118/723 E |
| 5,503,881 | A | * | 4/1996 | Cain et al. ....................... 438/716 |
| 6,565,661 | B1 | * | 5/2003 | Nguyen ........................ 118/715 |
| 6,716,302 | B2 | * | 4/2004 | Carducci et al. .......... 156/345.47 |
| 6,797,639 | B2 | * | 9/2004 | Carducci et al. ............... 438/710 |
| 7,361,228 | B2 | * | 4/2008 | Choi et al. ....................... 118/715 |
| 7,482,247 | B1 | * | 1/2009 | Papasouliotis et al. ........ 438/437 |
| 2001/0006093 | A1 | * | 7/2001 | Tabuchi et al. ................. 156/345 |
| 2002/0088545 | A1 | * | 7/2002 | Lee et al. .................. 156/345.33 |
| 2003/0041971 | A1 | * | 3/2003 | Kido et al. ................ 156/345.33 |
| 2005/0011447 | A1 | * | 1/2005 | Fink .............................. 118/715 |
| 2005/0211168 | A1 | * | 9/2005 | Yamada et al. ................ 118/715 |
| 2006/0021574 | A1 | * | 2/2006 | Armour et al. ................ 118/715 |
| 2006/0070702 | A1 | * | 4/2006 | Kido et al. ................ 156/345.33 |
| 2006/0090852 | A1 | * | 5/2006 | Kido et al. ................ 156/345.33 |
| 2006/0090853 | A1 | * | 5/2006 | Kido et al. ................ 156/345.33 |
| 2006/0130759 | A1 | * | 6/2006 | Kido et al. ...................... 118/715 |
| 2006/0157199 | A1 | * | 7/2006 | Kido et al. ................ 156/345.31 |
| 2007/0138134 | A1 | * | 6/2007 | Hsieh et al. ...................... 216/58 |
| 2008/0156631 | A1 | * | 7/2008 | Fair et al. ....................... 204/164 |
| 2009/0236313 | A1 | * | 9/2009 | Qiu et al. ......................... 216/67 |
| 2009/0250334 | A1 | * | 10/2009 | Qiu et al. ...................... 204/164 |
| 2010/0294860 | A1 | * | 11/2010 | Hsieh ............................ 239/548 |
| 2010/0300359 | A1 | * | 12/2010 | Armour et al. ................ 118/724 |

* cited by examiner

*Primary Examiner* — Jeffrie R Lund
(74) *Attorney, Agent, or Firm* — Knobbe Martens Olson & Bear LLP

(57) ABSTRACT

Systems, system components, and methods for plasma stripping are provided. In an embodiment, a gas flow distribution receptacle may have a rounded section that includes an inner surface defining a reception cavity, an outer surface forming an enclosed end, and a centerpoint on the outer surface having a longitudinal axis extending therethrough and through the reception cavity. First and second rings of openings provide flow communication with the plasma chamber. The second ring of openings are disposed between the first ring and the centerpoint, and each opening of the second ring of openings extends between the inner and outer surfaces at a second angle relative to the longitudinal axis that is less than the first angle and has a diameter that is substantially identical to a diameter of an adjacent opening and smaller than the diameters of an opening of the first ring of openings.

18 Claims, 5 Drawing Sheets

GAS FLOW DISTRIBUTION RECEPTACLES, PLASMA GENERATOR SYSTEMS, AND METHODS FOR PERFORMING PLASMA STRIPPING PROCESSES

TECHNICAL FIELD

The present invention generally relates to systems, system components, and methods for plasma stripping and more particularly relates to gas flow distribution receptacles, plasma generators, and methods for performing plasma stripping processes using such gas flow distribution receptacles and plasma generators.

BACKGROUND

Plasma stripping, also known as plasma ashing, is a process of removing organic matter and/or residue, such as photoresist, from a workpiece during semiconductor processing. Typically, plasma stripping is performed using a plasma generator. Conventional plasma generators include a tube, a coil, and a processing gas source. The tube may be made of a dielectric material, such as quartz, and may be at least partially surrounded by the coil. An inner surface of the tube defines a plasma chamber that is in flow communication with the processing gas source to receive a processing gas therefrom. To diffuse the processing gas before injection into the plasma chamber, a gas flow distribution receptacle, also made of a dielectric material, may be disposed over an inlet to the plasma chamber. The gas flow distribution receptacle typically includes a ring of evenly spaced openings to provide a flow path between the processing gas source and the plasma chamber.

During operation, the coil is energized and creates an electric field across the plasma chamber. As the processing gas flows through the electric field within the plasma chamber, a portion of the processing gas becomes ionized and forms plasma. The plasma dissociates another portion of the processing gas and transforms it into reactive radicals. The reactive radicals flow to and deposit onto the workpiece, which is disposed adjacent to a dispersion plate or showerhead of the plasma chamber, and react with the organic matter and/or residue thereon to form an easily removable ash or other material.

Although the aforementioned system yields high quality results, the system may be improved. For example, in instances in which the processing gas includes fluorine-comprising gases, such as tetrafluoromethane ($CF_4$), reactive fluorine radicals may be produced when the fluorine-comprising gas passes through the electric field. In some cases, the reactive fluorine radicals may chemically react with the quartz material of the gas flow distribution receptacle and/or the tube to cause erosion or etching thereof. In other cases, the chemical reaction may produce a silicon oxyfluoride (SiOF) film over the gas flow distribution receptacle and/or the tube. To avoid these unwanted effects, the gas flow distribution receptacle and/or tube are typically replaced once erosion is detected. However, some fluorine-comprising gases may erode or etch the components relatively quickly, and frequent replacement of these components may undesirably increase maintenance costs of the system.

Accordingly, it is desirable to have an improved plasma generator system that may be used in conjunction with fluorine-comprising processing gases such that the gases cause minimal etching of the system components. Additionally, it is desirable for the plasma generator system to include components, such as gas flow distribution receptacles, with improved useful lives compared to components of conventional plasma generator systems to thereby decrease maintenance costs of such systems. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
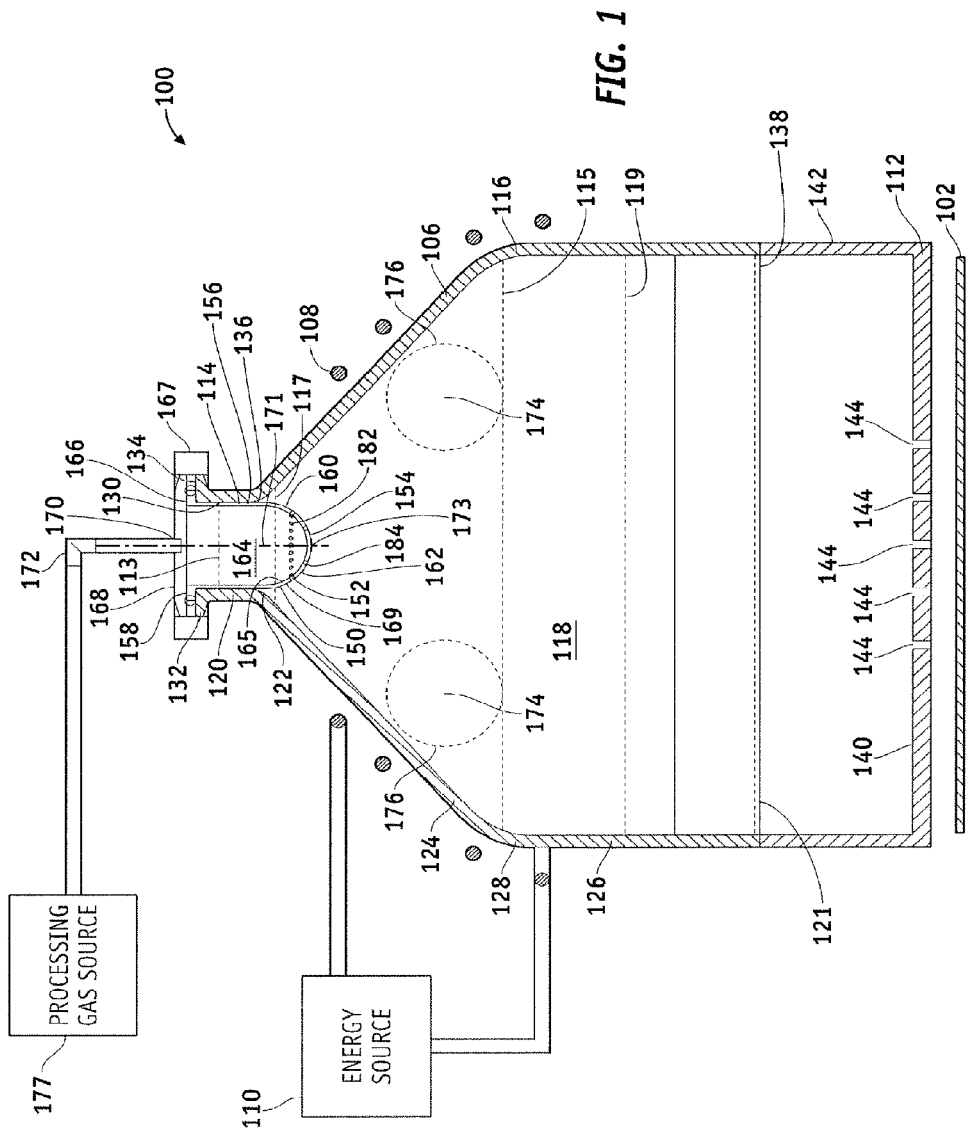
FIG. 1 is a simplified, cross-sectional view of a plasma generator system, according to an exemplary embodiment of the present invention.

FIG. 1 is a simplified, cross-sectional view of a plasma generator system 100, according to an exemplary embodiment of the present invention. The plasma generator system 100 is configured to selectively remove organic material from a workpiece 102 via plasma stripping. Plasma stripping, also known as "plasma ashing," may be employed to remove organic material, such as, for example, photoresist, organic residues, and/or polymer residues, from the workpiece 102 to clean the workpiece 102. In addition, plasma stripping also may be used to remove biological contamination from the workpiece 102, to enhance adhesion of layers to the workpiece 102 prior to deposition of such layers, to reduce metal oxides on the workpiece 102, or to otherwise etch a range of materials from the workpiece 102.

The workpiece 102 may be a semiconductor substrate and may be made of relatively pure silicon, germanium, gallium arsenide, or other semiconductor material typically used in the semiconductor industry, or of silicon admixed with one or more additional elements such as germanium, carbon, and the like, in an embodiment. In another embodiment, the workpiece 102 may be a semiconductor substrate having layers that have been deposited thereover during a conventional semiconductor fabrication process. In still another embodiment, the workpiece 102 may be a component, such as a sheet of glass, ceramic, or metal, that may be subjected to plasma stripping to remove unwanted organic materials thereon.

The plasma generator system 100 may be a remote, stand alone apparatus or an in-situ module that is incorporated into a processing system. The plasma generator system 100 shown in FIG. 1 is an example of a remote apparatus. In accordance with an exemplary embodiment of the present invention, the plasma generator system 100 includes a container 106, a coil 108, an energy source 110, a showerhead 112, and a gas flow distribution receptacle 114. Although an in-situ module may not be configured identically to the embodiment shown in FIG. 1, it may include similar components.

The container 106 is configured to receive a processing gas that can be ionized by an electric field and transformed into plasma suitable for dissociating the processing gas into reactive radicals and for removing organic material from the workpiece 102. In an exemplary embodiment, the container 106 is made of a material that is capable of enhancing the electric field. For example, the container 106 may be made of a dielectric material including, but not limited to quartz, aluminum/sapphire, and ceramic. To contain the plasma therein, the container 106 has a sidewall 116 that defines a plasma chamber 118. The sidewall 116 has any thickness that is suitable for containing plasma within the container 106 and that does not interfere with the electric field produced by the coil 108. In an exemplary embodiment, the sidewall 116 has a thickness in a range of from about 4 mm to about 6 mm. In another exemplary embodiment, the sidewall 116 has a substantially uniform thickness (e.g., ±0.5 mm) along its entire axial length. In still another embodiment, the sidewall 116 has a varying thickness along its axial length.

The sidewall 116, and hence, the plasma chamber 118, have a shape suitable for allowing the plasma to be directed toward the workpiece 102. In one exemplary embodiment, the sidewall 116 has a shape that varies along its axial length, as depicted in FIG. 1. For example, the sidewall 116 may include a neck section 120 extending from an inlet end 122 of a concave section 124 and a tube section 126 extending from an outlet end 128 of the concave section 124. The neck section 120 may be cylindrical and may have an inlet 130 and a lip 132 that protrudes radially outwardly from an end 134 of the neck section 120 proximate the inlet 130. In one exemplary embodiment, the neck section 120 has a substantially uniform diameter (shown as dotted line 113) (e.g., ±0.5 mm) along its axial length. In another exemplary embodiment, the neck section 120 has a varying diameter. In yet another exemplary embodiment, the diameter 113 is in a range of from about 30 mm to about 60 mm.

The concave section 124 may be dome-shaped, cone-shaped, or may have any other shape that is generally concave and that has an outlet end diameter (shown as dotted line 115) that is greater than an inlet end diameter (shown as dotted line 117). In one exemplary embodiment, the outlet end diameter 115 is also greater than the diameter 113 of the neck section 120. In another exemplary embodiment, the outlet end diameter 115 is in a range of from about 150 mm to about 350 mm, while the diameter 113 of the neck section 120 is in the range of from about 30 mm to about 60 mm. In other embodiments, the diameters 115, 113 may be larger or smaller than the aforementioned ranges. In accordance with another exemplary embodiment of the present invention, the tube section 126 has a substantially uniform diameter (shown as dotted line 119) that is substantially equal (e.g., ±0.5 mm) to the outlet end diameter 115 of the concave section 124. In another exemplary embodiment, the diameter 119 of the tube section 126 is greater than the outlet end diameter 115 of the concave section 124. In yet another exemplary embodiment, the diameter 119 of the tube section 126 is in a range of from about 150 mm to about 350 mm, and the outlet end diameter 115 of the concave section 124 may be in a range of from about 75 mm to about 300 mm. In other embodiments, the diameters 119, 115 may be larger or smaller than the aforementioned ranges.

The tube section 126 includes an outlet 138 from the plasma chamber 118 that may be at least as large as a diameter of the workpiece 102. In an exemplary embodiment, the outlet 138 has a diameter (depicted as dotted line 121) that is in the range of from about 150 mm to about 350 mm. In another exemplary embodiment, the outlet 138 has a diameter 121 that is smaller than or larger than the aforementioned ranges. For example, in embodiments in which only a desired portion of the workpiece 102 is to be subjected to plasma stripping, the diameter 121 of the outlet 138 corresponds to the size of the desired portion.

To allow the processing gas to transform into plasma, the coil 108 surrounds at least a portion of the container 106. In one exemplary embodiment, the coil 108 is disposed around at least a portion of the concave section 124. For example, in embodiments in which the concave section 124 is a dome or cone, the coil 108 may be positioned between the inlet end and the outlet end 128 thereof, as illustrated in FIG. 1. In another exemplary embodiment, the coil 108 additionally, or alternatively, surrounds the tube section 126. In any case, the coil 108 is made of a conductive material, such as, for example, copper, and is electrically coupled to the energy source 110. The energy source 110 may be a radio frequency (RF) voltage source or other source of energy capable of energizing the coil 108 to form an electric field. Thus, when the energy source 110 energizes the coil 108, the electric field is formed in a selected portion of the plasma chamber 118 to thereby ionize the processing gas that may flow therethrough to form ionized gas. As used herein, the term "ionized gas" may include, but is not limited to, ions, electrons, neutrons, reactive radicals, dissociated radicals, and any other species that may be produced when the processing gas ionizes.

A showerhead 112 may be positioned at the plasma chamber outlet 138 to control dispersion of the ionized gas, which may include reactive radicals, across the work piece 102. In one exemplary embodiment, the showerhead 112 includes a plate 140. The plate 140 may be made from any suitable material that is relatively inert with respect to the plasma, such as aluminum or ceramic. Generally, the plate 140 is sized to allow gas dispersion over an entirety of the workpiece 102 and thus, has a correspondingly suitable diameter. To allow gas passage therethrough, the plate 140 is relatively porous. In particular, the plate 140 includes through-holes 144 that are suitably sized and spaced to disperse the ionized gas over the work piece 102 in a substantially uniform manner. In one exemplary embodiment, the through-holes 144 have a diameter in a range of from about 2 mm to about 10 mm. In another exemplary embodiment, the through-holes 144 are present at a surface density in a range of from about 0.005 holes/mm$^2$ to about 0.2 holes/mm. In other embodiments, the through-holes 144 have larger or smaller dimensions than the ranges previously provided. In another exemplary embodiment, the through-holes 144 are substantially uniformly sized (e.g., ±0.5 mm). Additionally, the through-holes 144 are disposed in a substantially uniform pattern on the showerhead 112, in one exemplary embodiment but, in another exemplary embodiment, the through-holes 144 are disposed in a non-uniform pattern.

In an exemplary embodiment of the present invention, the showerhead 112 is directly coupled to the container 106, as shown in FIG. 1. For example, the showerhead 112 may include sidewalls 142 that extending axially from the plate 140 and that are coupled to the container 106 via bolts, clamps, adhesives or other fastening mechanisms. In another exemplary embodiment, the showerhead 112 is not coupled to the container 106 and the plate 140 is positioned at a desired location between the plasma chamber outlet 138 and the workpiece 102.

The processing gas may be diffused before injection into the plasma chamber 118 to uniformly distribute the gas thereto. In this regard, in one exemplary embodiment, the gas flow distribution receptacle 114 is disposed in a plasma chamber inlet 136, which may or may not be located at the neck section inlet 130. For example, as shown in FIG. 1, the gas flow distribution receptacle 114 is disposed in a portion of the neck section 120 of the container 106. With additional reference to FIG. 2, to further enhance even distribution of the processing gas, the gas flow distribution receptacle 114 has a cup member 150 with first and second rings 152, 154 (rings depicted in phantom) of openings 182, 184 formed therethrough.

The cup member 150 is made of a material that is non-conductive and is capable of withstanding corrosion when exposed to the processing gas. Suitable materials include, for example, dielectric materials such as quartz. Additionally, in one exemplary embodiment, the cup member 150 has a wall thickness that is substantially identical (e.g., ±0.5 mm) to the thickness of the neck section 120 of the container 106. In other embodiments, the cup member 150 may be thicker or thinner.

In any case, the cup member 150 may include a cylindrical section 156 and a rounded section 160. The cylindrical section 156 may define a portion of a reception cavity 164 having an open end 158. Additionally, the cylindrical section 156 may have an outer diameter that is less than the inner diameter of the plasma chamber inlet 136. In an exemplary embodiment, a flange 166 extends radially outwardly from the cylindrical section 156. The flange 166 may be used to retain the gas flow distribution receptacle 114 in position on the container 106 and may be clamped between a cover plate 168 and the container 106. In this regard, the outer diameter of the flange 166 is at least as large as a diameter of the neck section inlet 130. In an exemplary embodiment, the outer diameter of the flange 166 is substantially equal (e.g., ±0.5 mm) to the outer diameter of the container lip 132. In other examples, the outer diameter of the flange 166 may be larger or smaller. In another exemplary embodiment, the cover plate 168 has a diameter that is substantially equal to (e.g., ±0.5 mm) or larger than an outer diameter of the flange 166. For example, the flange 166 may have an outer diameter that is in the range of from about 40 mm to about 70 mm, and the cover plate 168 may have a diameter that is larger. In other embodiments, the diameters may be smaller or larger. A clamping fixture 167 may surround at least the flange 166, the cover plate 168, and the container lip 132 to ensure that the gas flow distribution receptacle 114 remains disposed at a desired location on the container 106. To allow access into the reception cavity 164, the cover plate 168 may include one or more openings 170. The openings 170 may be configured to receive one or more corresponding gas connection lines 172 to provide flow communication with a processing gas source 177.

The rounded section 160 is generally hemispherically-shaped and has an inner surface 165, an outer surface 169, and a centerpoint 173. The inner surface 165 defines another portion of the reception cavity 164, and the outer surface 169 forms an enclosed end 162 of the gas flow distribution receptacle 114. The centerpoint 173 is located on the outer surface 178 of the rounded section 160 and has a longitudinal axis 171 that extends therethrough and through the reception cavity 164. The first and second rings of openings 152, 154 are included on the rounded section 160 and are adapted to provide flow communication between the reception cavity 164 and the plasma chamber 118.

To control the manner in which the processing gas is injected into the plasma chamber 118, the openings 182 of the first ring 152 are disposed within the rounded section 160 so that the processing gas flows along predetermined gas injection paths. The gas injection paths generally allow the gas to flow axially from a first location in the reception cavity 164 through openings 152 to a second location substantially (e.g., ±0.5 mm) at a center 174 of a plasma zone 176 (indicated by dotted circles). The plasma zone 176 is toroidally-shaped due to the placement of the coils 108 around the container 106 and is identified by an area of the plasma chamber 118 having a highest density of plasma during plasma stripping. In an exemplary embodiment, the first location is a point in the reception cavity 164 that optimizes a pressure difference between the reception cavity 164 and the plasma chamber 118 to thereby maximize a velocity of the processing gas, while minimizing a distance to the plasma zone center 174. For example, the first location may be a point in the reception cavity 164 that is substantially equidistant (e.g., ±0.5 mm) from each point on a circumference of an inner surface of the rounded section 160. It will be appreciated that the location of the first ring 152 of openings 182 on the cup member 150 may depend on a particular location of the plasma zone center 174 within chamber 118.

Figure 2:
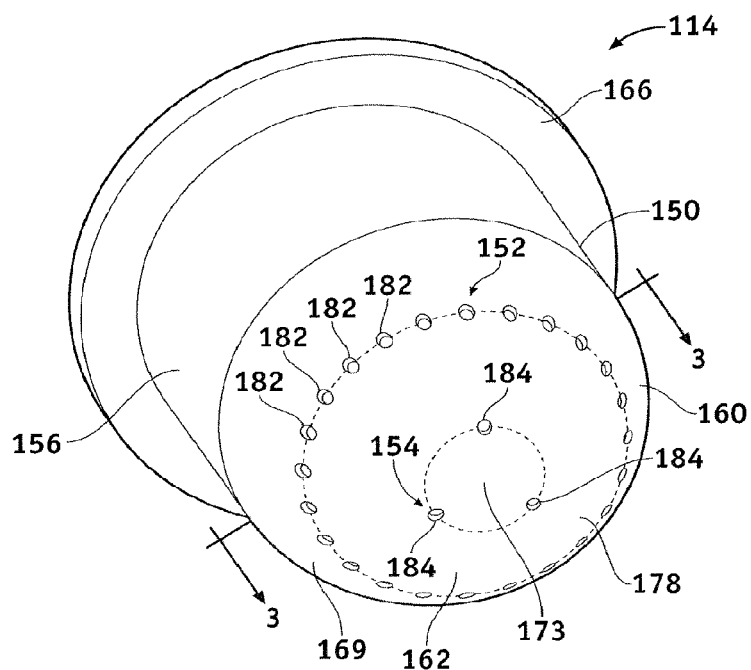
FIG. 2 is a perspective view of a gas flow distribution receptacle that may be used in the plasma generator system depicted in FIG. 1, according to an exemplary embodiment of the present invention.

The number of openings 182 included in the ring 152, the size of the openings 182, and the direction in which the openings 182 are formed relative to the receptacle outer surface 169 may be further selected to further control the manner in which the gas is injected. For example, to substantially evenly distribute the processing gas within the plasma chamber 118, the first ring 152 of openings 182 may include twenty to thirty openings. In one particular example, twenty-four openings may be included, as shown in FIG. 2. In still other embodiments, more or fewer openings may be included. In one exemplary embodiment, the openings 182 of the first ring 152 are disposed symmetrically about the longitudinal axis 171 and are substantially evenly spaced around a circumference of the rounded section 160. In another exemplary embodiment, the openings 182 of the first ring 152 are not evenly spaced around a circumference of the rounded section 160. For example, sets of two or more openings may be formed close together, and each set may be equally spaced from the longitudinal axis 171. In any case, the openings 182 are spaced such that the processing gas may be substantially evenly injected into the plasma chamber 118.

In one exemplary embodiment of the present invention, each opening 182 of the first ring 152 has a diameter that is substantially identical (e.g., ±0.5 mm) to a diameter of an adjacent opening 182 in the first ring 152. In another exemplary embodiment, the openings 182 of the first ring 152 have diameters that vary within a range. For example, each opening 182 may have a diameter that is within a range of from about 0.5 mm to about 3.0 mm. In other examples, the openings 182 may be larger or smaller than the aforementioned diameter range.

Figure 3:
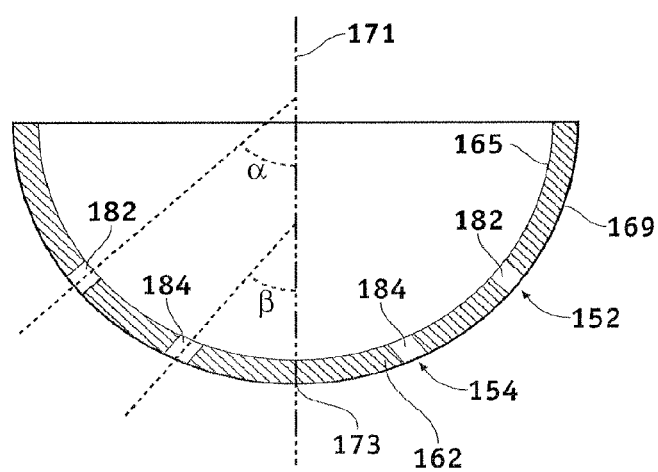
FIG. 3 is a close up view of a portion of the gas flow distribution receptacle as indicated by dotted line 3-3 in FIG. 2, according to an exemplary embodiment of the present invention.

Turning to FIG. 3, a close-up cross-sectional view of a portion of the gas flow distribution receptacle 114 taken along line 3-3 of FIG. 2 is provided. Each opening 182 of the first ring 152 of openings 182 extends between the inner surface 165 and the outer surface 169 of the receptacle 114 at a first angle (α) relative to the longitudinal axis 171. In an exemplary embodiment, to more evenly disperse the processing gas into the plasma chamber 118, the first angle (α) is greater than 0° relative to the longitudinal axis 171 and, preferably, is in a range of from about 30° to about 60°. For example, the first angle (α) may be about 45°. In other embodiments, the first angle may be less than or greater than the aforementioned range.

Figure 4:
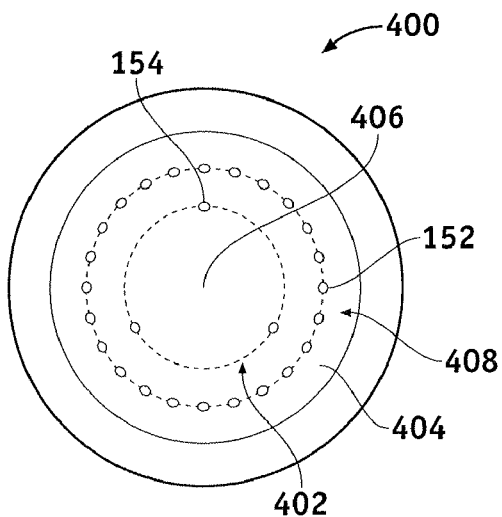
FIG. 4 is an end view of a gas flow distribution receptacle that may be used in the plasma generator system depicted in FIG. 1, according to another exemplary embodiment of the present invention.
Figure 5:
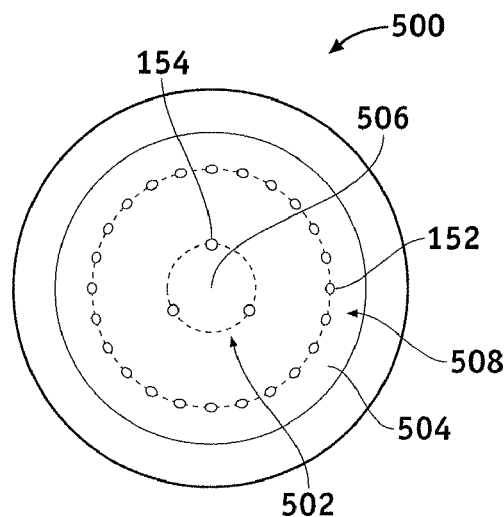
FIG. 5 is an end view of a gas flow distribution receptacle that may be used in the plasma generator system depicted in FIG. 1, according to another exemplary embodiment of the present invention.

Returning to FIG. 2, the second ring 154 of openings 184 is configured to form a flow curtain on an outer surface 178 of the rounded section 160 of the gas flow distribution receptacle 114 during system operation. The flow curtain prevents a majority of the ionized gas in the plasma chamber 118, in particular, the reactive radicals, from depositing onto and contacting the outer surface 178 of the gas flow distribution receptacle 114. In this regard, the second ring 154 of openings 184 is disposed between the first ring 152 of openings 182 and the centerpoint 173 of the rounded section 160. FIG. 4 is an end view of a gas flow distribution receptacle 400 that may be used in the plasma generator system 100 depicted in FIG. 1, according to one exemplary embodiment. Gas flow distribution receptacle 400 is similar to gas flow distribution receptacle 114 except that a second ring 402 of openings 184 is located equidistantly between a first ring 404 of openings 182 and a centerpoint 406 of a rounded section 408 of the gas flow distribution receptacle 400. FIG. 5 is an end view of a gas flow distribution receptacle 500 that may be used in the plasma generator system 100 depicted in FIG. 1, according to another embodiment. In this embodiment, gas flow distribution receptacle 500 is similar to gas flow distribution receptacle 400 except that a second ring 502 of openings 184 is located closer to a centerpoint 506 of a rounded section 508 than to the first ring 504 of openings 182. In one example, the distance from the second ring 502 of openings 184 to the centerpoint 506 may be about 25% of the distance from the first ring 504 of openings 182 to the centerpoint 506. In other embodiments, the second ring 502 may be closer or further away from the first ring 504.

Figure 6:
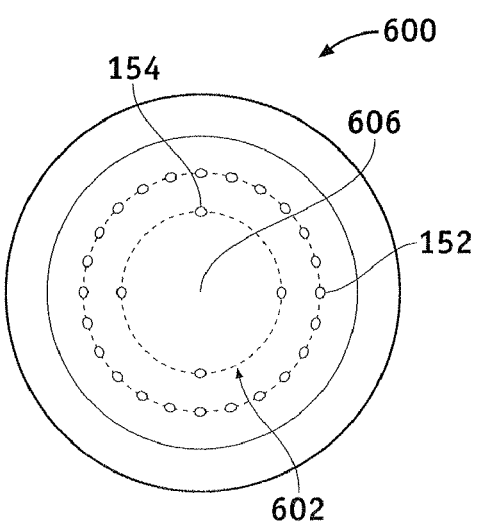
FIG. 6 is an end view of a gas flow distribution receptacle that may be used in the plasma generator system depicted in FIG. 1, according to another exemplary embodiment of the present invention.

It will be appreciated that the number of openings included in the second ring 154 of openings 184 may affect processing gas flow. In one exemplary embodiment, as shown in FIGS. 4 and 5, three openings are included in the second ring 402, 502. In another embodiment, more than three openings are included. FIG. 6 is an end view of a gas flow distribution receptacle 600 that may be used in the plasma generator system 100 depicted in FIG. 1, according to another embodiment. In this embodiment, gas flow distribution receptacle 600 is similar to gas flow distribution receptacle 114 except that four openings are included in a second ring 602 of openings 184. In still another exemplary embodiment not depicted, the second ring 602 may include more than four openings. In any case, the openings of the second ring 402, 502, 602 may be disposed substantially symmetrically about the longitudinal axis (not depicted in FIG. 4, 5 or 6) that extends through the centerpoint 406, 506, 606. In other embodiments, the openings may be disposed asymmetrically, as long as the flow curtain is formed during the plasma stripping process.

Returning back to FIG. 3, each opening 184 of the second ring 154 of openings 184 may extend between the inner surface 165 and the outer surface 169 of the gas flow distribution receptacle 114 at a second angle (β) relative to the longitudinal axis 171. In one exemplary embodiment, the second angle (β) is less than the first angle (α) at which the openings 182 of the first ring 152 of openings 182 are disposed, and the second angle is in a range of from about 20° to about 30°. For example, the second angle (β) may be about 22.5°. In other embodiments, the second angle may be less than or greater than the aforementioned range. Each opening 184 of the second ring 154 of openings 184 may have a diameter that is substantially identical (e.g., ±0.5 mm) to a diameter of an adjacent opening 184 in the second ring 154, but is smaller than the diameter of the openings 182 of the first ring 152 of openings 182. In one exemplary embodiment, the openings 184 of the second ring 154 of openings 184 are in a range of from about 50% to about 75% smaller than the openings 182 of the first ring 152 of openings 182. For example, the openings 184 of the second ring 154 of openings 184 may be about 66% smaller. In another exemplary embodiment, the openings 184 may have diameters that range from about 0.5 mm to about 2.5 mm in size. The openings 184 of the second ring 154 of openings 184 may be substantially uniformly sized (e.g., ±0.5 mm) or, alternatively, may vary within a size range.

Figure 7:
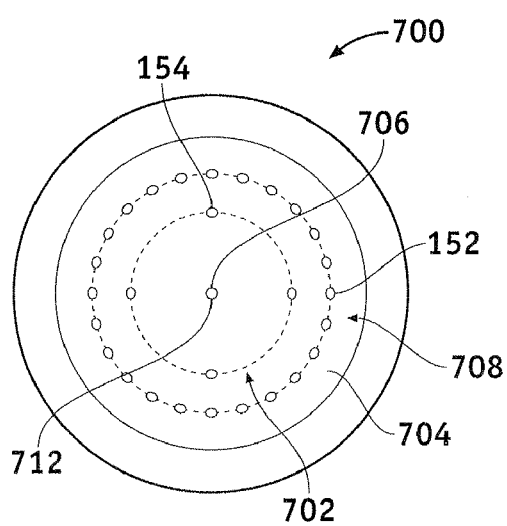
FIG. 7 is an end view of a gas flow distribution receptacle that may be used in the plasma generator system depicted in FIG. 1, according to another exemplary embodiment of the present invention.

Turning to FIG. 7, in an exemplary embodiment, a gas flow distribution receptacle 700, similar to gas flow distribution receptacle 114, includes a center opening 712 in addition to the first and second rings 704, 702. The center opening 712 is located at a centerpoint 706 of a rounded section 708 of the receptacle 700. In one exemplary embodiment, the center opening 712 has a diameter that is smaller than the diameters of the openings of the first and the second rings 704, 702. For example, the diameter of the center opening 712 may be in a range of from about 0.5 mm to about 1.5 mm. In another embodiment, the diameter of the center opening 712 is substantially equal (e.g., ±0.5 mm) to a diameter of an opening of the second ring 702.

Figure 8:
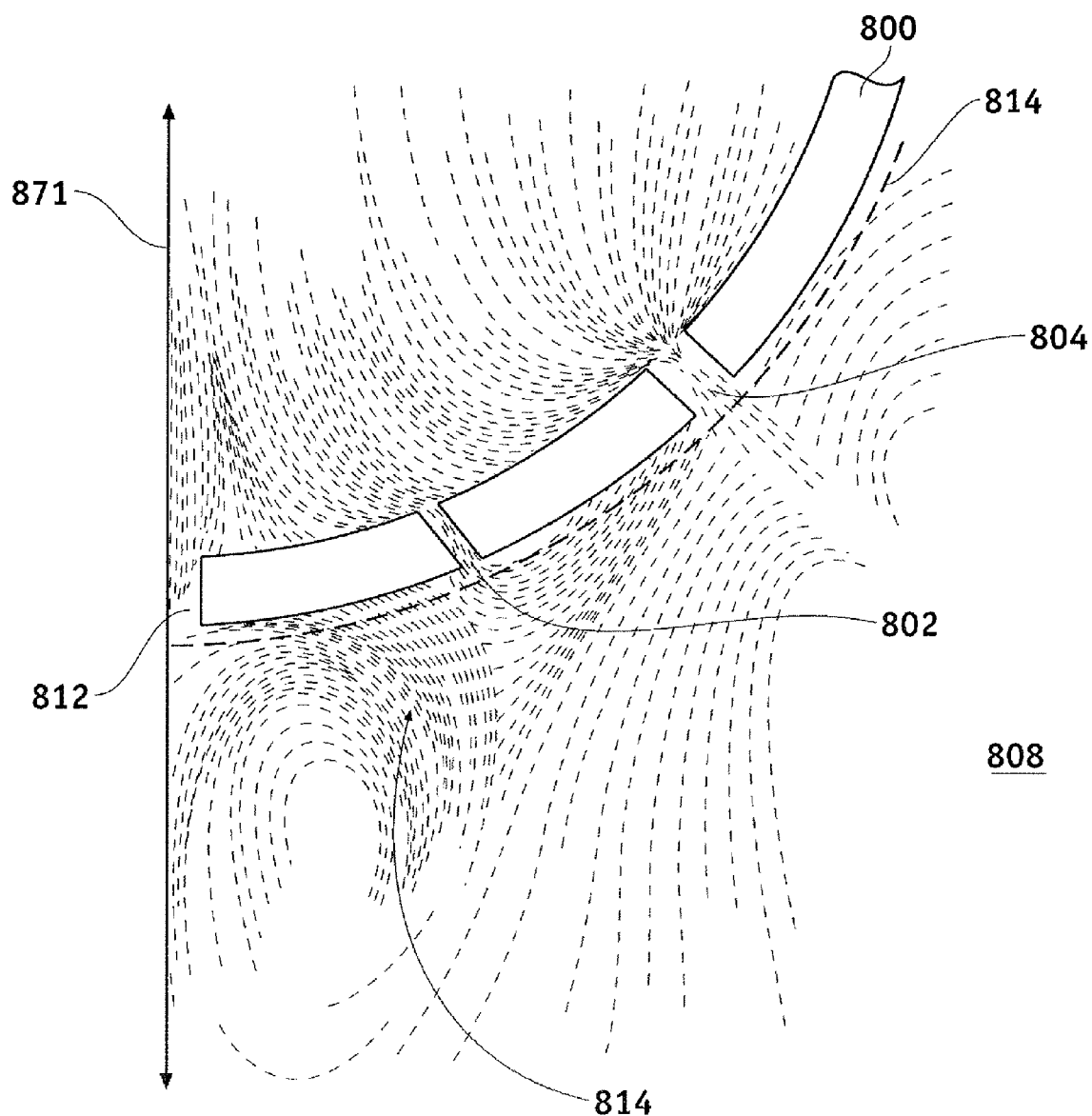
FIG. 8 is a diagram depicting flow of processing gas through a gas flow distribution receptacle, according to an exemplary embodiment of the present invention.

As briefly mentioned above, by including the second ring 154 of openings 184, 402, 502, 602, 702 and, optionally, the center opening 712, on the gas flow distribution receptacle 100, 400, 500, 600, 700, a flow curtain forms to prevent a majority of ionized gas circulating in the plasma chamber 118, and in particular, reactive radicals in the plasma chamber 118, from depositing or contacting the gas flow distribution receptacle 100, 400, 500, 600, 700 during a plasma stripping process. FIG. 8 is a diagram depicting flow of a processing gas through a gas flow distribution receptacle 800 that was constructed similar to the gas flow distribution receptacle 700 described above. The gas flow distribution receptacle 800 had a first ring of openings that included twenty-four (24) openings 804. Each opening 804 of the first ring extended through the receptacle 800 at an angle of about 45° from the longitudinal axis 871 and had a diameter of about 1.5 mm. The center opening 812 had a diameter of about 1 mm. The second ring of openings was disposed substantially equidistantly (e.g., ±0.5 mm) from the first ring of openings and the center opening 812 and had three (3) openings. Each opening 802 of the second ring of openings extended through the receptacle 800 at an angle of about 22.5° from the longitudinal axis and had a diameter of about 0.8 mm. The processing gas included a mixture of $O_2$, $N_2$, and $CF_4$, and was flowed into the receptacle 800 at a flow rate of about 100 m/s.

As illustrated in FIG. 8, a first portion of the processing gas flowed through the openings 804 of the first ring of openings into the plasma chamber 808 and then recirculated and carried reactive radicals toward the receptacle 800. A second portion of the processing gas flowed through the openings 802 of the second ring of openings and through the center opening 812. This second portion of the processing gas then divided such that some of the gas flowed into the plasma chamber 808 and some remained close to the surface of the gas flow distribution receptacle 800 to create a flow curtain (indicated by dotted line 814) thereover. The flow curtain 814 pushed the recirculated gas from the plasma chamber 808 away from the receptacle 800 to swirl in the chamber 808, rather than contact the receptacle 800.

Figure 9:
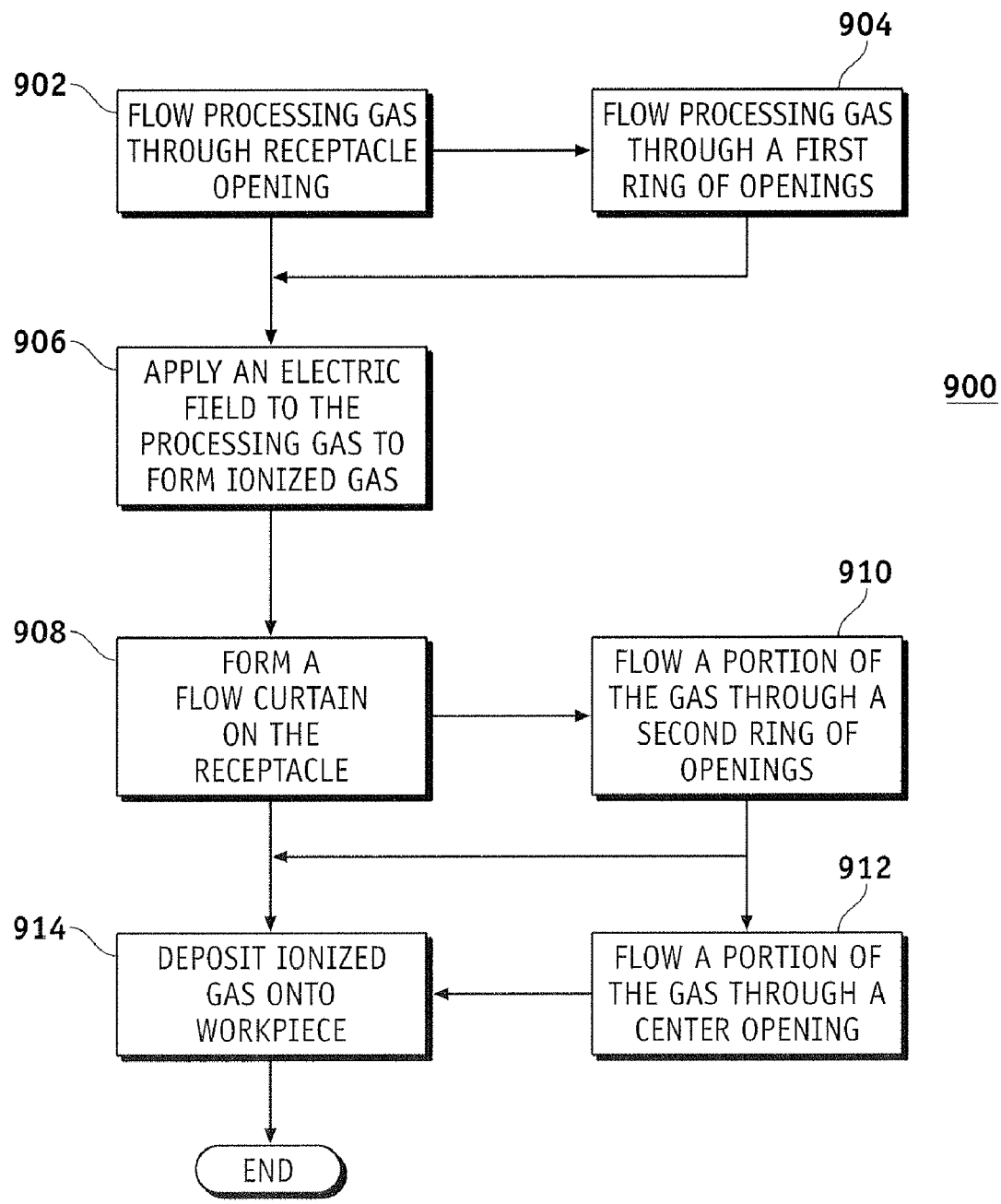
FIG. 9 is a flow diagram of a method for performing a plasma stripping process, according to an exemplary embodiment of the present invention.

As noted above, the plasma generator system 100 may be used for plasma stripping processes. FIG. 9 is a flow diagram of a method 900 of performing a plasma stripping process, according to an exemplary embodiment of the present invention. First, processing gas is flowed through openings, such as openings 182 of the first ring 152 of openings 182 shown in FIGS. 1-3, formed in a gas flow distribution receptacle, step 902. In an exemplary embodiment, the processing gas comprises one or more gases that may be ionized to form reactive species that can be deposited onto the workpiece to remove unwanted organic material therefrom. The particular gas selected for the processing gas may depend on the particular organic material to be removed. In an exemplary embodiment, the processing gas includes a fluorine-comprising gas. Examples of fluorine-comprising gases suitable for use include nitrogen trifluoride ($NF_3$), sulfur hexafluoride ($SF_6$), hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$), octofluoro[1-]butane ($C_4F_8$), octofluoro[2-]butane ($C_4F_8$), octofluoroisobutylene ($C_4F_8$), fluorine ($F_2$), and the like. In another embodiment, the processing gas may additionally comprise an oxygen-comprising gas. For example, the oxygen-comprising gas may include, but is not limited to, oxygen ($O_2$) and $N_2O$. In other embodiments, the processing gas may additionally comprise an inert gas, such as, for example, nitrogen ($N_2$), helium, argon, and the like. In one exemplary embodiment, the processing gas may be a mixture of gases, such as $O_2/N_2/CF_4$ at a ratio of 20:8:1 by flow percent. In other embodiments, the mixture may include different ratios of the aforementioned gases. In still other embodiments, different gases and different ratios may be used.

In an exemplary embodiment, a first portion of the processing gas flows through a first ring of openings of the gas flow distribution receptacle into a plasma chamber in flow communication therewith, step 904. Each opening of the first ring of openings extends through the gas flow distribution receptacle in a manner substantially similar to the descriptions above with respect to FIGS. 2-7. In particular, each opening may be formed at a first angle relative to a longitudinal axis that extends through a centerpoint of a rounded section of the receptacle. In an exemplary embodiment, the first angle at which each opening of the first ring of openings is formed is in the range of from about 30° to about 60° relative to the longitudinal axis. Each opening may have a diameter that is substantially identical (e.g., ±0.5 mm) to a diameter of an adjacent opening in the first ring.

An electric field is applied to the processing gas to transform the processing gas into an ionized gas including reactive radicals, step 906. In an exemplary embodiment, a coil around the plasma chamber is energized to form an electric field. The electric field extends across the plasma chamber to form a plasma zone. As the processing gas flows into the plasma zone, a portion of the gas ionizes to form plasma, and the plasma dissociates another portion of the gas to form reactive radicals. For example, in an embodiment in which the processing gas includes a fluorine-comprising gas, a portion of the fluorine-comprising gas ionizes to form plasma. The remaining portion of the fluorine-comprising gas may be dissociated by the plasma and transformed into reactive fluorine radicals. In an exemplary embodiment of the present invention, some of the reactive fluorine radicals may flow through the plasma chamber, through a showerhead, and may deposit on the workpiece, while another portion of the reactive fluorine radicals may recirculate within the plasma chamber before depositing onto the workpiece.

To prevent a majority of the ionized gas including the reactive radicals in the plasma chamber from depositing onto the outer surface of the gas flow distribution receptacle, a flow curtain is formed thereon, step 908. In an exemplary embodiment, a second portion of the gas flows into the plasma chamber through a second ring of openings formed in the rounded section between the centerpoint of the rounded section and the first ring of openings, step 910. Each opening of the second ring of openings is formed substantially identically as described above with respect to FIGS. 2-7. In particular, each opening of the second ring of openings extends through the gas flow distribution receptacle at a second angle relative to the longitudinal axis that is less than the first angle. In an exemplary embodiment, the second angle at which each opening of the second ring of openings is formed is in a range of from about 20° to 30° relative to the longitudinal axis. In another embodiment, the second angle at which each opening of the second ring of openings is formed is about 22.5° relative to the longitudinal axis. Each opening may have a diameter that is substantially identical (e.g., ±0.5 mm) to a diameter of an adjacent opening in the second ring and that is less than the diameters of each opening of the first ring of openings.

In an optional embodiment, a third portion of the gas flows into the plasma chamber via a center opening formed in the center of the gas flow distribution receptacle on the longitudinal axis to form another portion of the flow curtain, step 912. The center opening may have a diameter that is less than that of the openings of the first and second rings of openings, in an embodiment. In another embodiment, the center opening has a diameter that is substantially equal (e.g., ±0.5 mm) to that of the openings of the second ring of openings.

As mentioned briefly above, the ionized gas is then deposited onto the workpiece, step 914. For example, the ionized gas, including reactive radicals, flows from the plasma chamber, through the showerhead, onto the workpiece.

Hence, an improved plasma generator system has been provided that may be used in conjunction with fluorine-comprising processing gases with reduced etching of the system components, as compared with conventional plasma generator systems. Additionally, improved gas flow distribution receptacles having improved useful lives as compared to components of conventional plasma generator systems have been provided. The inclusion of these improved gas flow distribution receptacles may decrease maintenance costs of plasma generator systems.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A gas flow distribution receptacle for providing gas flow to a plasma chamber for forming an ionized gas, the gas flow distribution receptacle having a rounded section comprising:
an inner surface defining a reception cavity;
an outer surface forming an enclosed end of the rounded section; and
a centerpoint on the outer surface, the centerpoint having a longitudinal axis extending therethrough and through the reception cavity,
wherein the rounded section further includes a first ring of openings and a second ring of openings adapted to provide flow communication with the plasma chamber, each opening of the first ring of openings extending between the inner surface and the outer surface at a first angle relative to the longitudinal axis mad having a diameter that is substantially identical to a diameter of an adjacent opening in the first ring of openings, the second ring of openings disposed between the first ring of openings and the centerpoint and configured to form a flow curtain over the outer surface of the receptacle to substantially prevent contact between the ionized gas and the outer surface of the receptacle, each opening of the second ring of openings extending between the inner surface and the outer surface at a second angle relative to the longitudinal axis that is less than the first angle and having a diameter that is substantially identical to a diameter of an adjacent opening in the second ring of openings and smaller than the diameters of an opening of the first ring of openings.

2. The gas flow distribution receptacle of claim 1, wherein the diameter of each opening of the second ring of openings is about 66% of the diameter of each opening of the first ring of openings.

3. The gas flow distribution receptacle of claim 1, wherein the first ring of openings includes twenty to thirty openings.

4. The gas flow distribution receptacle of claim 1, wherein the first angle is in a range of from about 30° to 60° relative to the longitudinal axis.

5. The gas flow distribution receptacle of claim 1, wherein the second angle is in a range of from about 20° to 30° relative to the longitudinal axis.

6. The gas flow distribution receptacle of claim 1, wherein the second ring of openings comprises a plurality of openings disposed symmetrically about the longitudinal axis.

7. The gas flow distribution receptacle of claim 1, wherein the second ring of openings comprises a plurality of openings disposed symmetrically about the longitudinal axis and the second angle of the second ring of openings is about 22.5° relative to the longitudinal axis.

8. The gas flow distribution receptacle of claim 1, wherein the second ring of openings is equidistant from the first ring of openings and the centerpoint of the rounded section.

9. The gas flow distribution receptacle of claim 1, wherein the second ring of openings is formed closer to the centerpoint of the rounded section than to the first ring of openings.

10. The gas flow distribution receptacle of claim 1, further comprising a center opening formed at the centerpoint of the rounded section.

11. The gas flow distribution receptacle of claim 10, wherein the center opening has a diameter that is substantially equal to the diameter of a first opening of the second ring of openings.

12. A plasma generator system for forming an ionized gas, the system comprising:
a container defining a plasma chamber, the plasma chamber having an inlet and an outlet;
a gas flow distribution receptacle disposed within the inlet of the plasma chamber, the gas flow distribution receptacle having a rounded section comprising:
an inner surface defining a reception cavity;
an outer surface forming an enclosed end of die rounded section; and
a centerpoint on the outer surface, the centerpoint having a longitudinal axis extending therethrough and through the reception cavity,
wherein the rounded section further includes a first ring of openings and a second ring of openings adapted to provide flow communication with the plasma chamber, each opening of the first ring of openings extending between the inner surface and the outer surface at a first angle relative to the longitudinal axis and having a diameter that is substantially identical to a diameter of an adjacent opening in the first ring of openings, the second ring of openings disposed between the first ring of openings and the centerpoint and configured to form a flow curtain over the outer surface of the receptacle to substantially prevent contact between the ionized gas and the outer surface of the receptacle, each opening of the second ring of openings extending between the inner surface and the outer surface at a second angle relative to the longitudinal axis that is less than the first angle and having a diameter that is substantially identical to a diameter of an adjacent opening in the second ring of openings and smaller than the diameters of an opening of the first ring of openings; a coil surrounding the container; and
an energy source electrically coupled to the coil.

13. The system of claim 12, wherein the first angle is in a range of from about 30° to 60° relative to the longitudinal axis.

14. The system of claim 12, wherein the second angle is in a range of from about 20° to 30° relative to the longitudinal axis.

15. The system of claim 12, wherein second ring of openings comprises a plurality of openings disposed symmetrically about the longitudinal axis and the second angle of the second ring of openings is about 22.5° relative to the longitudinal axis.

16. The system of claim 12, wherein the container and the gas flow distribution receptacle are integrally formed.

17. The system of claim 12, further comprising a center opening formed at the centerpoint of the rounded section.

18. A gas flow distribution receptacle for providing gas flow to a plasma chamber for forming an ionized gas, the gas flow distribution receptacle having a rounded section comprising:
an inner surface defining a reception cavity;
an outer surface forming an enclosed end of the rounded section;
a means for providing flow communication between the reception cavity and the plasma chamber; and
a means for forming a flow curtain over the outer surface of the receptacle to substantially prevent contact between the ionized gas and the outer surface of the receptacle.

* * * * *

UNITED STATES PATENT AND TRADEMARK OFFICE
CERTIFICATE OF CORRECTION

PATENT NO. : 8,110,068 B2
APPLICATION NO. : 12/052401
DATED : February 7, 2012
INVENTOR(S) : Huatan Qiu et al.

It is certified that error appears in the above-identified patent and that said Letters Patent is hereby corrected as shown below:

At column 5, line 1, change "holes/mm" to --holes/mm$^2$--.

At column 11, line 23, in Claim 1, change "mad" to --and--.

At column 12, line 12, in Claim 12, change "die" to --the--.

Signed and Sealed this
Twenty-sixth Day of June, 2012

David J. Kappos
*Director of the United States Patent and Trademark Office*